(12) United States Patent
Schroth et al.

(10) Patent No.: US 9,966,819 B2
(45) Date of Patent: May 8, 2018

(54) ELECTRIC MACHINE

(71) Applicant: Robert Bosch GmbH, Stuttgart (DE)

(72) Inventors: Ruediger Schroth,
Renningen-Malmsheim (DE); Klaus Herbold, Asperg (DE); Gianna Rivera-Schlottbohm, Dortmund (DE); Vassilios Sekertzis, Stuttgart (DE)

(73) Assignee: SEG Automotive Germany GmbH, Stuttgart (DE)

( * ) Notice: Subject to any disclaimer, the term of this patent is extended or adjusted under 35 U.S.C. 154(b) by 519 days.

(21) Appl. No.: 14/414,440

(22) PCT Filed: Jul. 11, 2013

(86) PCT No.: PCT/EP2013/064661
§ 371 (c)(1),
(2) Date: Jan. 12, 2015

(87) PCT Pub. No.: WO2014/009458
PCT Pub. Date: Jan. 16, 2014

(65) Prior Publication Data
US 2015/0171714 A1    Jun. 18, 2015

(30) Foreign Application Priority Data

Jul. 11, 2012  (DE) .................. 10 2012 212 163

(51) Int. Cl.
*H02K 11/04* (2016.01)
*H01L 25/11* (2006.01)
*H02K 5/22* (2006.01)

(52) U.S. Cl.
CPC .......... *H02K 11/046* (2013.01); *H01L 25/115* (2013.01); *H01L 2924/0002* (2013.01); *H02K 5/225* (2013.01); *H02K 2203/09* (2013.01)

(58) Field of Classification Search
CPC ........ H02K 3/28; H02K 5/225; H02K 11/046; H01L 25/115; H01L 2924/0002; H01L 2924/00
See application file for complete search history.

(56) References Cited

U.S. PATENT DOCUMENTS 4,307,437 A    12/1981  Severing
4,809,057 A *  2/1989  Ocken ................... H01L 23/562
                                                          257/687

(Continued)

FOREIGN PATENT DOCUMENTS

DE    102008045745    4/2009
GB       2433354       6/2007

OTHER PUBLICATIONS

International Search Report for Application No. PCT/EP2013/064661 dated Dec. 2, 2013 (English Translation, 2 pages).

*Primary Examiner* — Quyen Leung
*Assistant Examiner* — Eric Johnson
(74) *Attorney, Agent, or Firm* — Michael Best & Friedrich LLP

(57) ABSTRACT

The invention relates to an electric machine (10) which is embodied as an alternator, comprising a rotor (20) and an axis of rotation (183), a stator iron (17) which maintains a stator winding (18). Said stator winding (18) comprises phase terminals of winding wires (204), a rectifier circuit (151) which comprises at least one bridge circuit consisting of a positive diode (99) and a negative diode (58). Said positive diode (99) and the negative diode (58) are connected in an electrically conductive manner to the phase terminal of winding wires (204) by means of a metal connecting element (133, 146) which has two half arms (215). One half arm (215) is connected in an electrically conductive manner to a positive diode (99) by means of a connecting section (216) and another half arm (215) is connected in an electrically conductive manner to the negative diode (58) by means of another connecting section. The (Continued)

half arms (215) are oriented in front of the connecting sections (216) in such a manner that the metal surfaces (240) are oriented perpendicular to a rotational axis (183) of the rotor (20). The half arms (215) are arranged parallel to each other on a longitudinal section in front of the connecting sections (216). Said connecting sections (216) start respectively from a half arm (215) and comprise ends (217) which are aligned counter to each other.

10 Claims, 21 Drawing Sheets

(56) References Cited

U.S. PATENT DOCUMENTS

| | | | |
|---|---|---|---|
| 5,866,963 A | 2/1999 | Weiner et al. | |
| 6,275,404 B1* | 8/2001 | Shichijyo | H02K 19/365 310/68 D |
| 6,429,556 B1* | 8/2002 | Nakamura | H01R 39/32 310/68 D |
| 6,552,908 B2 | 4/2003 | Denardis | |
| 7,531,925 B2 | 5/2009 | Bradfield et al. | |
| 2004/0135443 A1* | 7/2004 | Tajima | H02K 5/20 310/68 D |
| 2004/0217663 A1* | 11/2004 | Kumagai | B23K 11/0026 310/71 |
| 2009/0058211 A1* | 3/2009 | Oowatari | H02K 3/02 310/179 |
| 2012/0126638 A1* | 5/2012 | Tanaka | H02K 11/046 310/43 |

\* cited by examiner

ELECTRIC MACHINE

BACKGROUND OF THE INVENTION

U.S. Pat. No. 7,531,925 B2 has disclosed an alternator which rectifies alternating-current voltages by means of diodes. For interconnection of the stator terminal wires and diodes, connecting elements which are led in parallel are provided. U.S. Pat. No. 6,552,908 B2 and DE 2856194 are also known.

According to the invention, provision is made for thereby utilizing a particular elasticity in the connection of the rectifier circuit and thus preventing excessive tensile or compressive stresses in diode head wires or diode connectors and interconnection elements.

According to one aspect, it is achieved that, by means of the half-arms which, before the connecting sections, are arranged directly adjacent to one another, a particularly expedient flow arrangement is attained, and thus a low flow resistance is attained. This increases the air throughflow, or restricts this to a lesser extent. If the half-arms are arranged so as to be twisted relative to one another, that is to say if for example the upper edges of the mutually parallel upper edges, such as they are per se intended to be provided, of the half-arms are twisted or skewed relative to one another, this very specifically realizes an excessive tensile or pressure loading between one half-arm and a connecting terminal of a diode. One possible particularly inexpensive but adequately strong connection between interconnection element and insulator is achieved by virtue of the interconnection element being plugged into a receiving section of the insulator of the interconnection device. A particularly space-saving arrangement is attained in that, from an interconnection element, there extends a connecting section which serves for providing a phase signal to a controller, having a U-shaped cooling body which is arranged around an axis of rotation, wherein the U-shaped cooling body and the bearing shield receive the connecting section between them. A simple production method can be selected by virtue of the half-arms, the connecting sections and the plug-in section of the interconnection element being bent around an axial direction. Expedient flow conditions are likewise achieved by virtue of the half-arms and the connecting sections together being oriented so as to form a T-shape.

BRIEF DESCRIPTION OF THE DRAWINGS

The inventions will be explained in more detail below by way of example and on the basis of the figures, in which.

DETAILED DESCRIPTION

Figure 1:
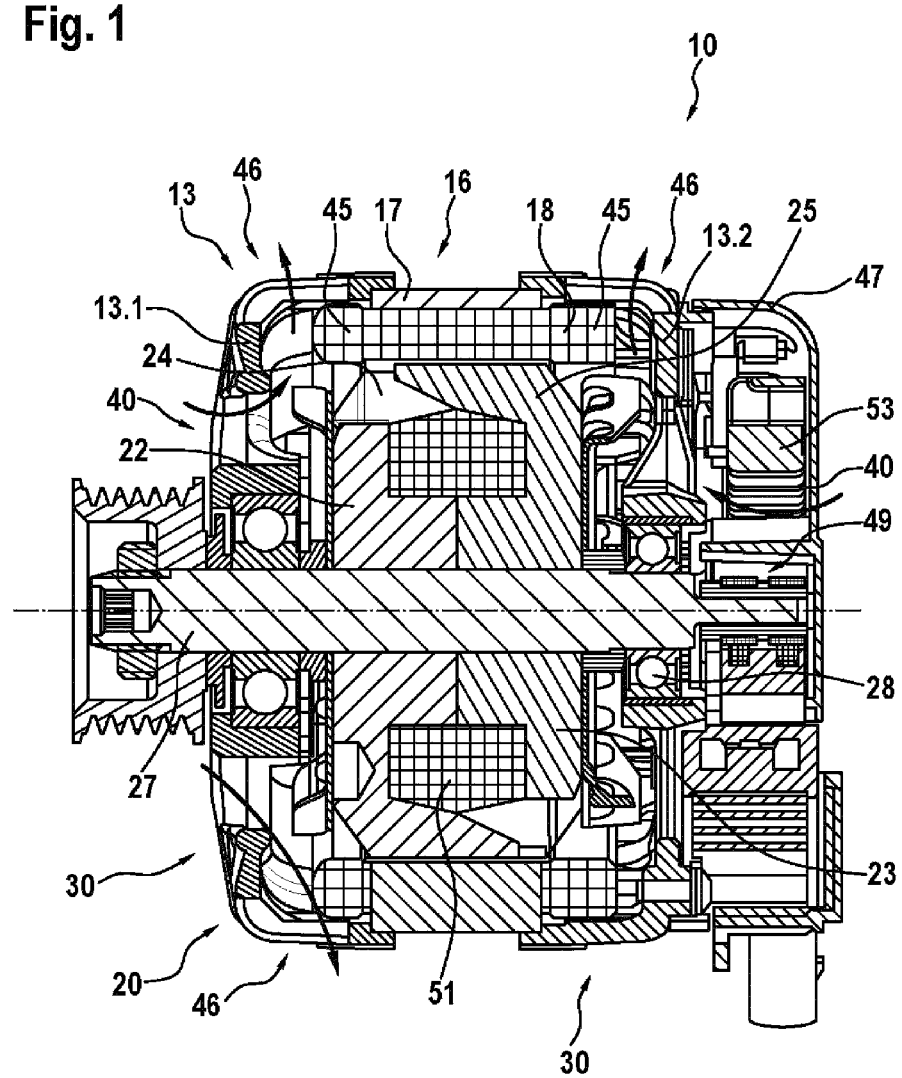
FIG. 1 shows a cross section through an electric machine.

FIG. 1 illustrates a cross section through an electric machine 10, in this case embodied as a generator or alternator, in particular three-phase generator for motor vehicles. Inter alia a two-part housing 13 which comprises a first bearing shield 13.1 and a second bearing shield 13.2. The bearing shield 13.1 and the bearing shield 13.2 receive between them a so-called stator 16 which, on one side, comprises a substantially circular ring-shaped stator iron 17, into the radially inwardly directed, axially extending grooves of which there is inlaid a stator winding 18. Said annular stator 16 surrounds, by way of its radially inwardly directed grooved surface, which is an electromagnetically active surface 19, a rotor 20, which in this case is for example in the form of a claw pole rotor. The rotor 20 comprises inter alia two claw pole boards 22 and 23, on the outer circumference of which there are arranged claw pole fingers, which each extend in the axial direction, as electromagnetically polarizable poles 24 and 25. The two claw pole boards 22 and 23 are arranged in the rotor 20 such that their claw pole fingers or poles 24 and 25, which extend in the axial direction, alternate with one another over the circumference of the rotor 20. The rotor 20 accordingly likewise has an electromagnetically active surface 26. The poles 24 and 25 which alternate over the circumference result in magnetically required intermediate spaces 21, which in this case are also referred to as claw pole intermediate spaces. The rotor 20 is rotatably mounted in the respective bearing shields 13.1 and 13.2 by means of a shaft 27 and a respective rolling bearing 28 situated on each rotor side.

It is also mentioned here that, in this application, the feature "axial" refers in the conventional manner to the axial direction of the axis of rotation of the rotor.

The rotor 20 has a total of two axial face surfaces, to each of which there is fastened a fan 30. Said fan 30 is composed substantially of a plate-like or disk-like section from which fan blades extend in a known manner. Said fans 30 serve for permitting, via openings 40 in the bearing shields 13.1 and 13.2, an air exchange for example from an axial face side of the electric machine 10 through the interior of the electric machine 10 to the surroundings situated radially at the outside. For this purpose, the openings 40 are provided substantially at the axial ends of the bearing shields 13.1 and 13.2, via which openings cooling air is drawn by means of the fans 30 into the interior of the electric machine 10. Said cooling air is, by the rotation of the fans 30, drawn axially into the housing 13 from the respective axial face side, and is accelerated radially outward so as to be able to pass through the winding overhang 45 which is permeable to cooling air. By means of this effect, the winding overhang 45 is cooled. After passing through the winding overhang 45 and/or flowing around said winding overhang 45, the cooling air follows a path radially outward through openings not illustrated in FIG. 1. The path of the cooling air or the cooling air flow through the machine from axially outside may also be referred to as cooling air path 46.

The protective cap 47 which is illustrated in FIG. 1 and which is situated on the right-hand side of the generator protects various components against environmental influences. For example, said protective cap 47 covers, for example, a so-called slipring assembly 49 which serves for supplying field current to a field winding 51. Around said slipring assembly 49 there is arranged a cooling body 53 which in this case acts as a positive cooling body. Said positive cooling body is referred to as positive cooling body because it is connected in electrically conductive fashion to a positive terminal of a battery (for example starter current supply). The bearing shield 13.2 acts as a so-called negative cooling body. Between the bearing shield 13.2 and the cooling body 53 there is arranged a connection plate 56 which serves for connecting negative diodes 58 arranged in the bearing shield 13.2 and positive diodes (not shown in this illustration) in the cooling body 53 to one another, and thus realizing a bridge circuit (rectifier) such as is known per se.

Figure 2:
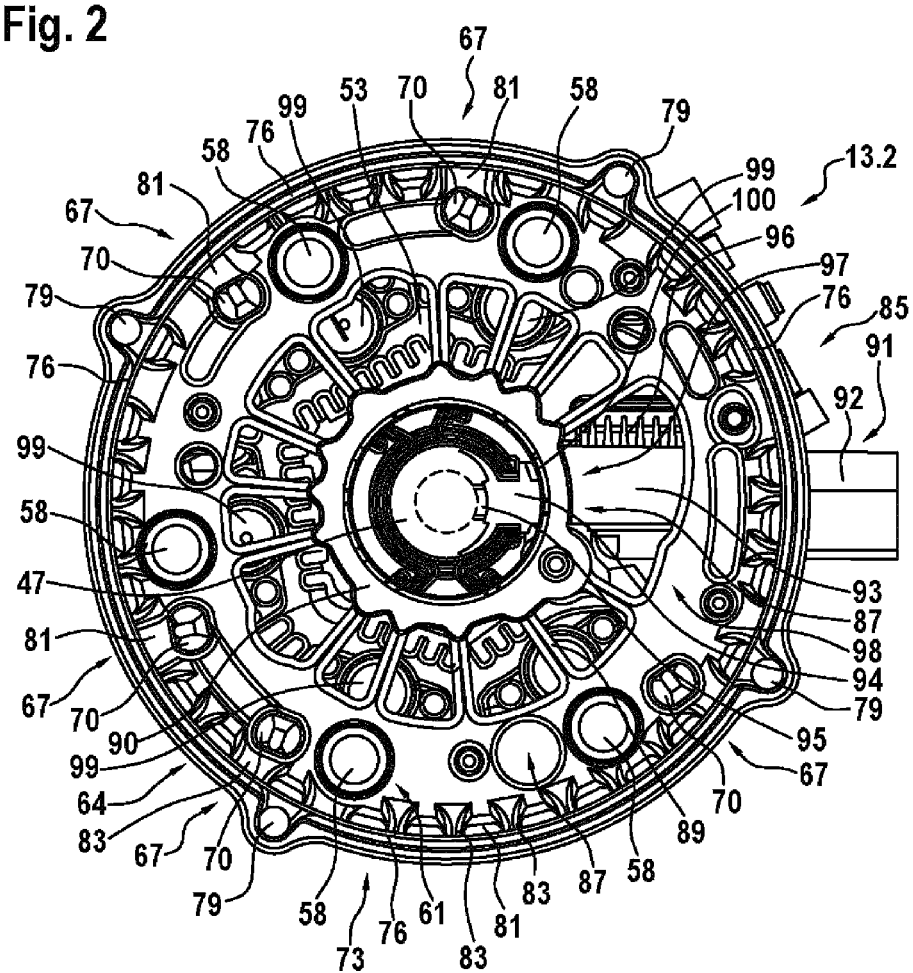
FIG. 2 shows a view of a bearing shield from axially inside.

FIG. 2 illustrates a view of the bearing shield 13.2 from axially inside, without the stator 16, rolling bearings 28 and rotor 20. The so-called brush-side bearing shield 13.2 also serves in this case as a so-called cooling body for the negative diodes 58. Said negative diodes 58 are pressed into cylindrical openings 61. The cylindrical openings 61 and thus also the negative diodes 58 are, to some extent, arranged in uniformly spaced fashion in the bearing shield 13.2. For this purpose, an annular region 64 is provided for the negative diodes 58. Adjacent to the negative diodes 58 there are situated further openings 67 into which so-called guide stubs 70 project. Said guide stubs 70 are part of an interconnection device which will be discussed further below. On the outer circumference of the bearing shield 13.2 there is situated an annular web 73. Said web 73 serves, by way of an axial abutment surface 76, to provide an axial abutment surface for the stator 16. The abutment surface 76 is provided fourfold in total, in each case corresponding to a quarter of a circular ring. Between two abutment surfaces 76 or at the corresponding circumferential position, there are situated a total of four passage holes 79. Said passage holes 79 serve overall for the passage of four screw bolts in order to enable the stator 16 to be braced between two bearing shields 13.1 and 13.2. The web 73 is adjoined in the axial direction by several openings 81, as have already been discussed above. The openings 81 are separated from one another generally by webs 83. In this context, there are two particular sections over the circumference of the bearing shield 13.2. The first section is situated between the 12 o'clock position and the 10:30 position. The second section is situated between the 10:30 position and the 8 o'clock position. As can be seen at the 12 o'clock, 10:30 and 8 o'clock positions, an opening 81 transitions from its circumferential position into the axial face surface of the bearing shield 13.2 to such an extent that the opening 81 also receives a guide stub 70.

Thus, an electric machine 10 is disclosed, having a housing 13 which has a bearing shield 13.2, and having a rectifier circuit 151 which has an interconnection device 130, wherein the interconnection device 130 has a guide stub 70 which serves for receiving and guiding winding wire 204, having openings 81 in the bearing shield 13.2, which openings are separated from one another by webs 83, wherein the openings 81 extend from a circumferential side of the bearing shield 13.2 into an axial face surface of the bearing shield 13.2, and a guide stub 70 is received in an opening 81 in the region of the axial face surface of the bearing shield 13.2.

Radially within—that is to say in a position radially further to the inside in relation to—the annular region 64, there is a further annular region 85. Said further annular region 85 is a region in which axial throughflow openings 87 and webs 89 alternate.

At the so-called 3 o'clock position, there is situated a so-called controller 91 with a plug region 92, with an integrally formed housing region 93 adjoining said plug region radially to the inside, and with a cartridge region 94, adjoining said housing region in turn, in which brushes 95 are received. A controller 91 serves for supplying current to the field winding 51 such that a suitable voltage prevails in the stator coil 18 or at a downstream on-board electrical system terminal of the electric machine 10. In FIG. 2, the brushes 95 are shown as they would be or are arranged if the slipring assembly 49 were arranged in the operating position. From the housing region 93 there extend cooling fins 96 which are part of a cooling body. A radially inwardly directed contour 97 of the housing region 93 is in this case adapted, by way of a shoulder 88, to the outer contour 98 of the hub 90, FIG. 2a.

Figure 2A:
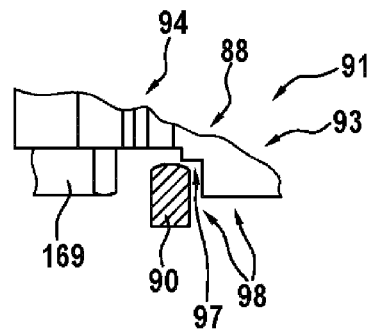
FIG. 2*a* shows a detail view of a hub, with parts of the electric machine arranged in the vicinity thereof.

FIG. 2a shows a detail view of an arrangement of hub 90, of a wall 169 of a slipring chamber protection means, which will be discussed in more detail again further below, and the controller 91. The three items are in this case arranged such that the hub 90 is adjacent to the controller 91 or the housing region 93 thereof radially from the outside (to the right in FIG. 2a), is adjacent to the wall 169 radially from the inside (to the left in FIG. 2a), and is adjacent to the cartridge region 94 of the controller 91 from one axial side (from above in FIG. 2a).

The description of the electric machine 10 proposed here proposes a construction with a housing 13 which has a bearing shield 13.2 and a rotor 20 mounted by means of the bearing shield 13.2, wherein, for this purpose, the bearing shield 13.2 has a hub 90, with a controller 91 which has a housing region 93 and a cartridge region 94, and with a wall 169 of a slipring chamber protection means, wherein the hub 90 is adjoined radially from the outside by the housing region 93 of the controller 91, radially from the inside by the wall 169 of the slipring chamber protection means, and axially from outside the housing 13 by the cartridge region 94, such that the housing region 93 of the controller 91, the wall 169 of the slipring chamber protection means and the cartridge region 94 extend in sections around the hub 90.

In the circumferential direction, the controller 91 is also adjoined by the cooling body 53 which is in the form of an open ring. Said cooling body 53 likewise has cylindrical openings into which, in the example, five positive diodes are inserted. The five positive diodes 99 are seated, in the example, at the same circumferential positions as the negative diodes 58. The webs 89, at their radially inner end, bear a hub 90, into the bore of which there is inserted a fitting ring 100. Said fitting ring 100, in the operating state, bears the rolling bearing 28. Looking through the hub 90 or the fitting ring 100, an inner side of the protective cap 47 can be seen.

Figure 3:
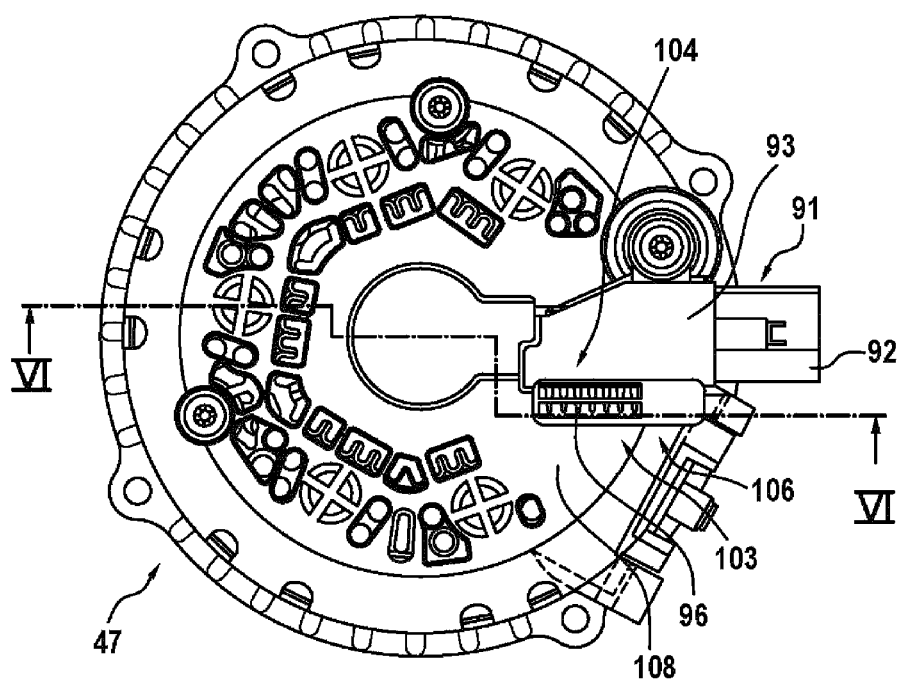
FIG. 3 shows the arrangement from FIG. 2 from an outer side of a protective cap.

FIG. 3 shows the arrangement from FIG. 2 from the outer side of the protective cap 47. At the 3 o'clock position, the controller 91 with its plug region 92 and the housing region 93 can be seen. Through two openings 103 and 104 (at least one opening must be provided here), the cooling fins 96, already mentioned above, of a controller cooling body can be seen. The two openings 103 and 104 are formed into a part 106 of the protective cap 47 which has a substantially cuboidal form. Said part 106 is for example designed to project beyond a surface section 108. The surface section 108 is substantially flat and defines the largest part of the area of the flat region of the protective cap 47, and also the region of the openings in the protective cap. Said surface section 108 transitions, virtually or entirely at the same level, into that surface of the housing region 93 which can be seen in FIG. 3. The controller 91, by way of the surface 109 of the housing region 93, thus forms, together with the said surface section 108 of the protective cap 47, a common surface at one level.

The cooling path and thus a cooling path part 110 (which is a part of the entire cooling air path 46 through the housing 13) for a cooling body 153 of the controller 91 with its fins 96 passes in this case strictly axially through the two openings 103 and 104, passes through the intermediate spaces between the cooling fins 96, and passes directly through the throughflow opening 87 illustrated in FIG. 2. There, the air is finally centrifuged radially outward by the fan 30 already mentioned above. The cooling path part 110 thus runs rectilinearly in the axial direction between an opening 103, 104 for the entry of the cooling air flow through an outermost surface of the machine 10 and a throughflow opening 87 in the bearing shield 13.2.

Thus, an electric machine 10 with a housing 13 is disclosed which has a bearing shield 13.2 and with a rotor 20 which is mounted by means of the bearing shield 13.2, wherein a fan 30 fastened to the rotor 20 is suitable for generating a cooling air flow along a cooling air path 46 through the housing 13, with a controller 91 which is fastened at least indirectly to the bearing shield 13.2, wherein the controller 91 has a cooling body 153 which can be cooled by a part of the cooling air flow along a cooling path part 110, wherein the controller 91 is arranged such that the cooling body 153 can be cooled by a part of the cooling air flow flowing past the cooling body in an axial direction along the cooling path part 110. The cooling air flow is delimited in a circumferential direction by a plate-like base 167 of the cooling body 153.

Figure 4:
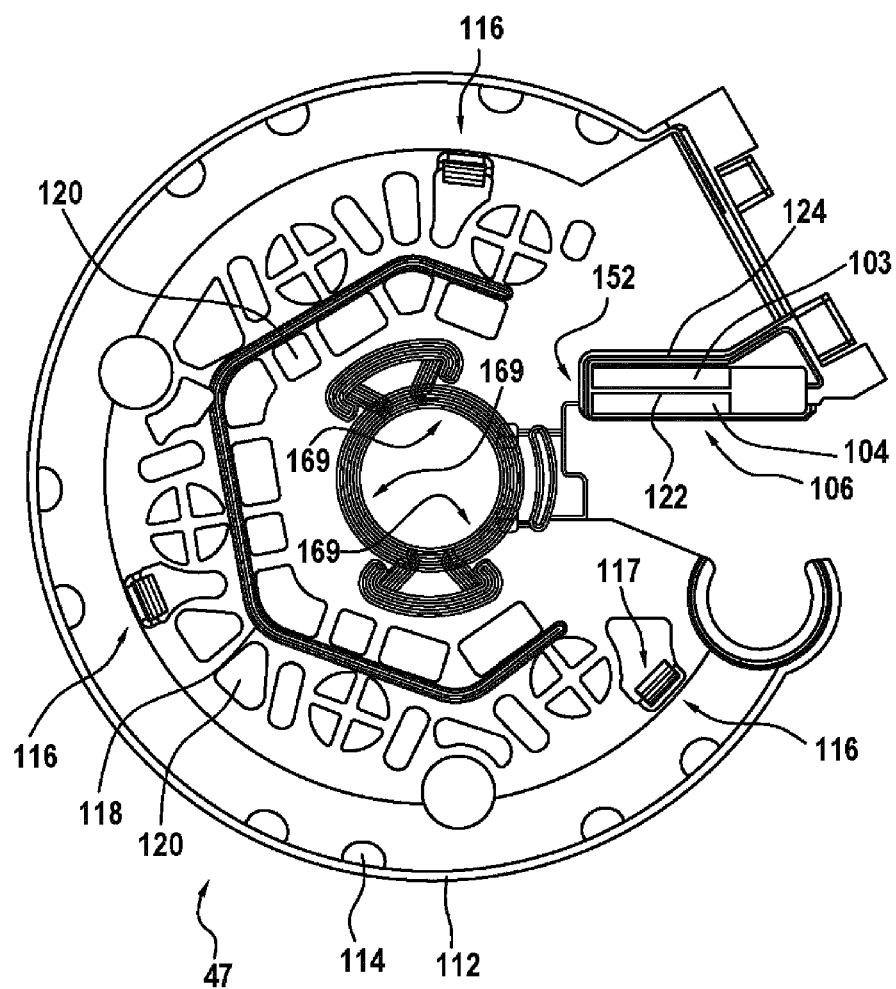
FIG. 4 shows the inner side of the protective cap.

FIG. 4 illustrates the inner side of the protective cap 47. Its collar-like outer edge 112 has multiple inlet openings 114 over the circumference. Furthermore, three snap-action hooks 116 extend in an axial direction. The beam-like bending part of the snap-action hooks 116 cannot be seen in this view. Only the engaging hook part 117 is illustrated. Openings 120 for the cooling air are situated on both sides of a rib 118 for reinforcing the protective cap 47. The two openings 103 and 104 of the cuboidal part 106 are separated from one another by a web 122. A wall 124 which is formed preferably integrally with the protective cap 47 delimits a flow path for cooling the controller 91. It is thus ensured that an excessive amount of air does not flow past the cooling fins 96 of the controller cooling body. In this case, the wall 124 is situated with a substantially radially oriented section directly opposite the cooling fins 96. The wall 124 is thus arranged between the controller 91 and the cooling body 53 of the rectifier circuit 151. It is optionally provided, as illustrated here, that the wall 124 has a section 152 which is oriented in a circumferential direction and which delimits the cooling air path radially to the inside. Thus, the cooling path part 110 is delimited at one side by the plate-like base 167 and at the other side by the wall 124.

Figure 5:
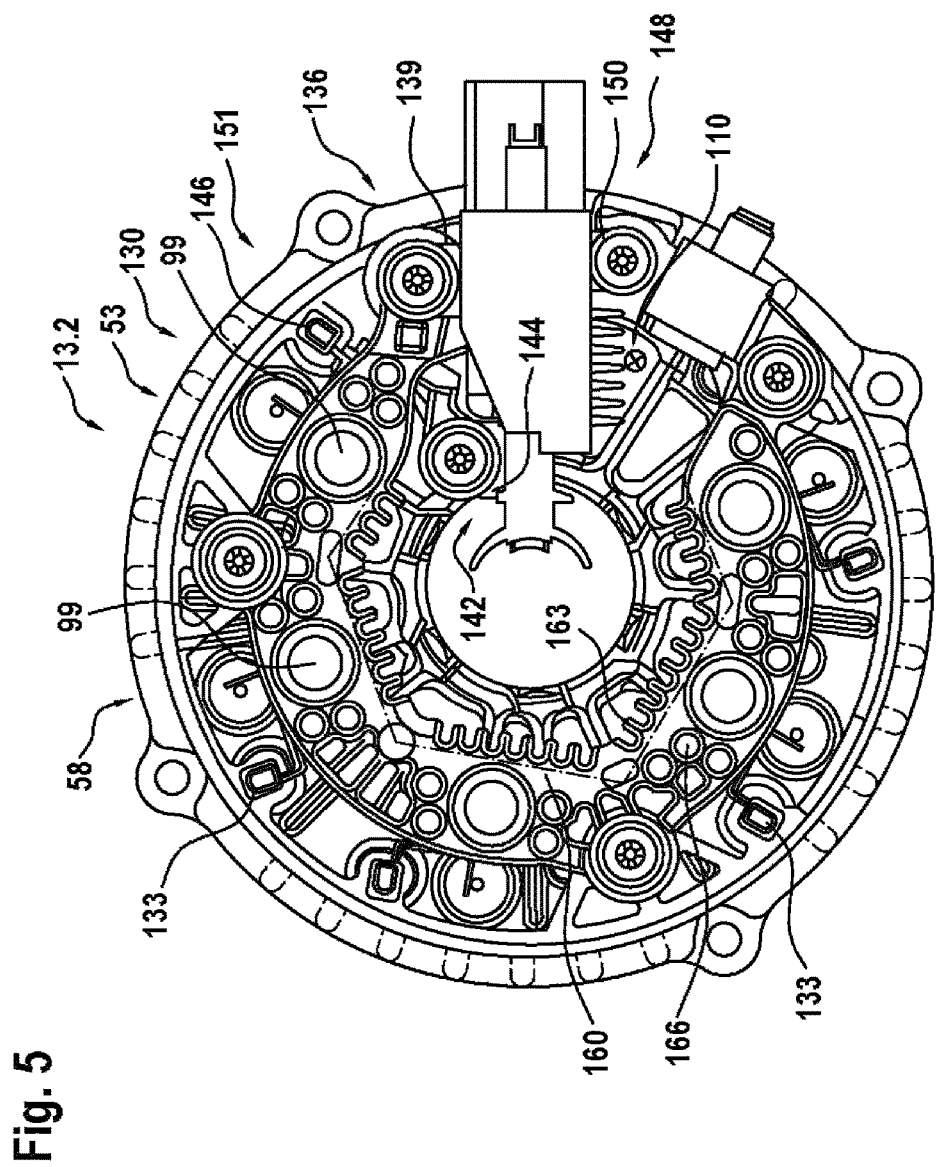
FIG. 5 shows the arrangement from FIG. 3 with the protective cap having been removed.

FIG. 5 shows the arrangement from FIG. 3 with the protective cap 47 having been removed. On the bearing shield 13.2 there is mounted an interconnection device which bears various interconnection elements 133. Situated above the interconnection device 130 is the cooling body 53, which is mounted, at various support points, on elements of the interconnection device 130. The cooling body 53, which has an open circular ring shape, is connected to a contact part 139 of the controller 91 at a screw connection point 136. At a further screw connection point 142 situated radially further toward the inside, the controller 91 is, by means of a further contact part 144, connected in contacting fashion to an interconnection element 146. At a third screw connection point 148, the controller 91 is, by means of a third contact part 150, connected in contacting fashion to the bearing shield 13.2 such that the contact part 150 is connected to ground. The interconnection elements 133 and 146 serve for connecting positive diodes 99, negative diodes 58 and phase terminals (not illustrated here) of the stator winding 18 to one another such that the positive cooling body or cooling body 53 has a positive potential and the negative cooling body or the bearing shield 13.2 is connected to ground. FIG. 5 thus shows a rectifier circuit 151 such as is known in principle.

Figure 5A:
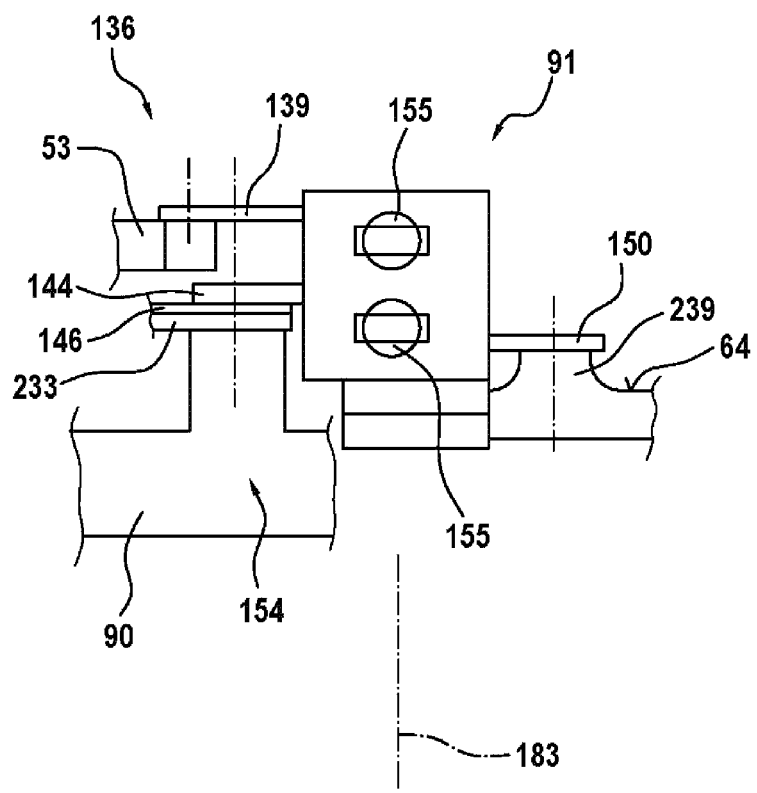
FIG. 5*a* shows a view of the controller from radially inside.

FIG. 5a shows a view of the controller 91 from radially inside. The controller has the housing already mentioned above with the housing region 93 through which three lugs in the form of perforated sheet-metal sections emerge or project. The three perforated sheet-metal sections are the contact part 139, the contact part 150 and the contact part 144. The contact part 139 is a "terminal" which is in contact with B+, the contact part 144 is the so-called terminal V, which receives a phase signal owing to the contact with the interconnection element 146, and the contact part 150 is electrically connected to the housing 13, and thus connected to negative potential. As can be seen in conjunction with FIG. 5 and FIG. 18, a dome 154 is configured so as to be seated in an axial direction on the hub 90. The three perforated sheet-metal sections, contact part 139, contact part 150 and contact part 144, are arranged in three different planes: the contact part 139 is furthest remote from the annular region 64, the contact part 144 is arranged axially between the contact part 139 and the contact part 150 and furthermore emerges from the housing region 93 from the cartridge region 94 between the two cartridges 155. The contact part 150 is the closest to the annular region 64.

Figure 5B:
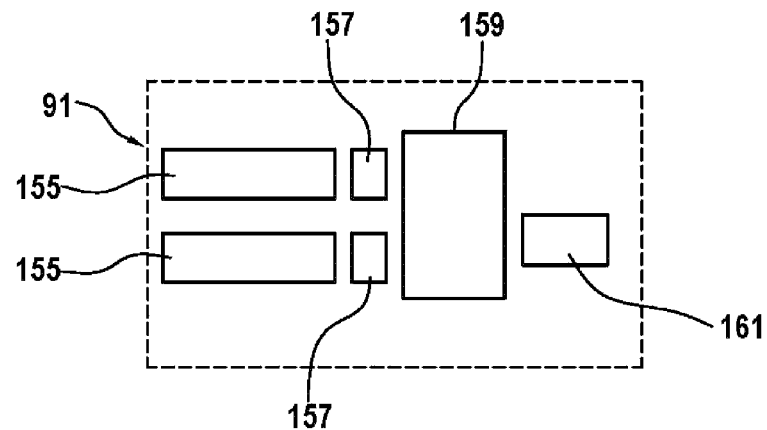
FIG. 5*b* shows a view of the controller in a plan view.

FIG. 5b shows a plan view of the controller 91 in a schematic view. The controller 91 comprises multiple chambers: two cartridge chambers of the cartridges 155 in one plane or one plane space, two diversion chambers 157, in each case situated axially therebehind, for connecting lines (strands), which diversion chambers receive a major part of the connecting lines when the brushes 95 have been pushed in. Behind the diversion chambers there is situated a chamber 159 in which electrical components are received and arranged in sealed fashion under a casting compound. The chamber 159 and the cartridge chambers or cartridges 155 thus receive the diversion chambers 157 between them. The diversion chambers 157 and a plug chamber 161 receive the chamber 159 between them.

Figure 5C:
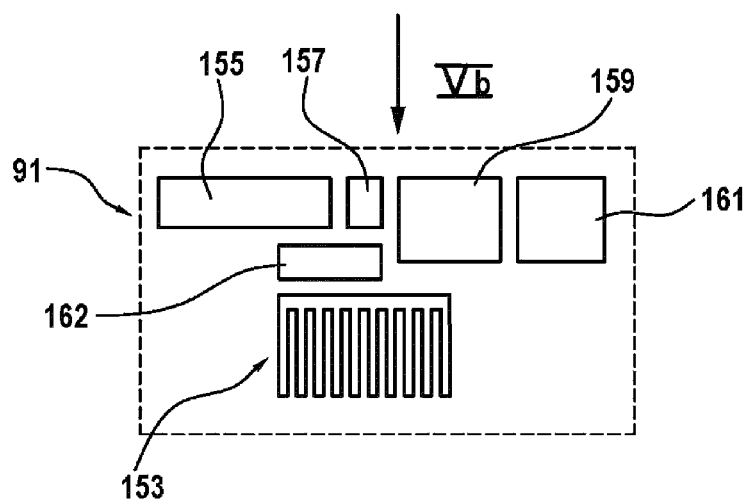
FIG. 5*c* shows a view of the controller in a side view.

FIG. 5c shows a side view of the arrangement from FIG. 5b: it is additionally pointed out that a chamber 162 for receiving an electronic component extends so far that it is adjacent both to the cartridge chambers or cartridges 155 and the diversion chambers 157 at one side, and to the cooling body 153 at the other side. The chamber 162 for receiving an electronic component is consequently arranged between the group composed of the cartridge chambers or cartridges 155 and the diversion chambers 157 and, at the other side, the cooling body 153.

Figure 6:
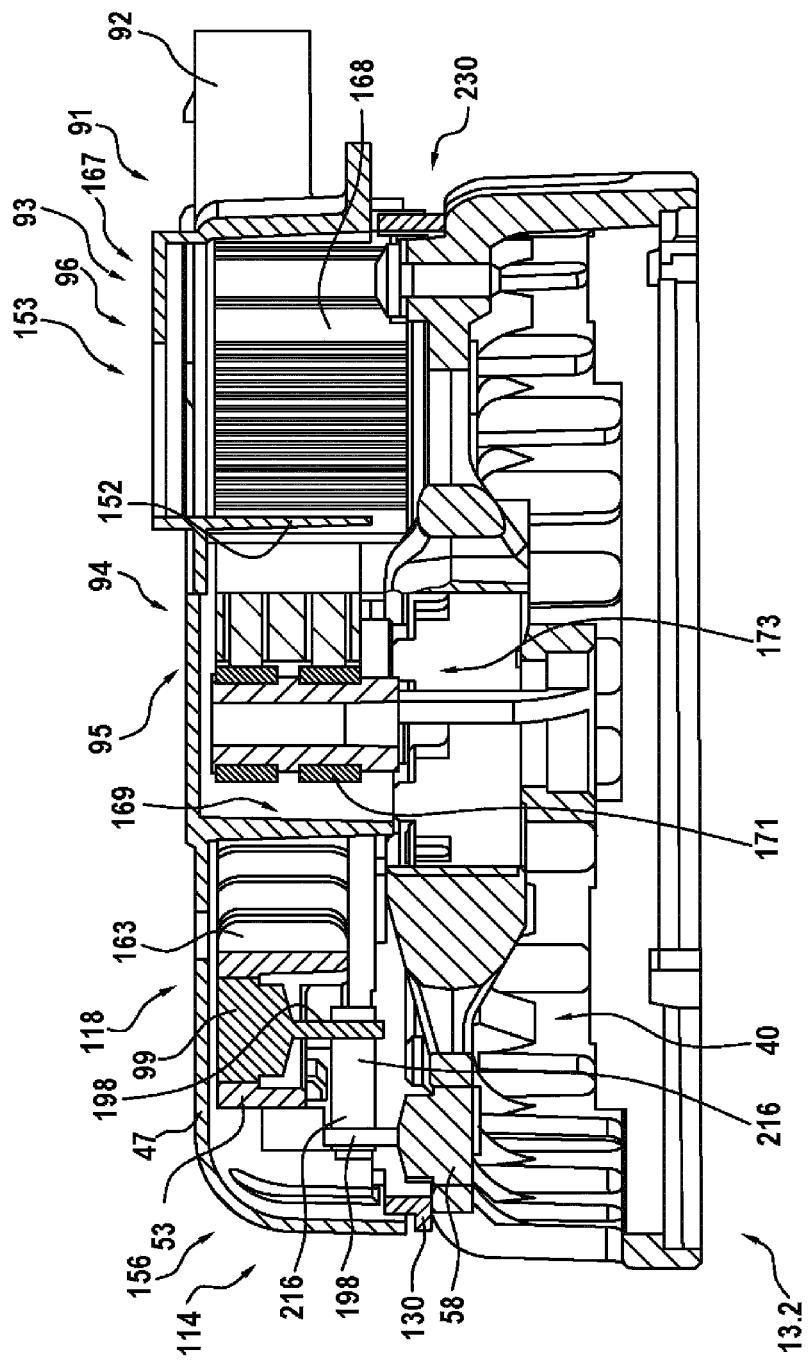
FIG. 6 shows a longitudinal section as indicated in FIG. 3.

FIG. 6 shows a longitudinal section corresponding to the profile of the section line VI-VI in FIG. 3. Seated on the above-mentioned bearing shield 13.2 is the interconnection device 130, on which, in turn, the cooling body 53 is mounted. The controller 91 is illustrated in the region on the right. It is possible to clearly see the plug region 92, the housing region 93, the cartridge region 94 and the brushes 95. It is also possible here, in a side view, to see the cooling body 153 of the controller 91. This view affords a direct view of the cooling fins 96.

Finally, the protective cap 47 is illustrated in section. Here, it is possible to see, for example, the details of the inlet openings 114 which extend from the purely circumferential region into a diversion region 156 of the protective cap. The diversion region 156 is the region which constitutes the materially integral transition within the protective cap 47 from the circumferential region to a maximum face surface 158 of the protective cap 47. As can also be seen here, the web 118 is seated on an inner edge region of the cooling body 53 (positive cooling body). Said web 118 serves, in interaction with the cooling body 53, to effect a separation of the flow before the flow reaches the openings 40. Here, the web 118 is seated on the cooling body 53 along a line 160 or is situated a short distance above the cooling body 53. Said line 160 extends in this case substantially on the inner circumference of the cooling body 53 counterclockwise from a positive diode 99 at the 1 o'clock position (FIG. 5) to the positive diode 99 at the 5 o'clock position. The interaction of the web 118 with the cooling body 53 has the effect that, in the assembled state, a cooling air flow radially within the line 160 cools the radially inwardly directed cooling fins 163 (openings) of the cooling body 53, and an approaching flow radially outside the line 160 flows through the openings 166 situated in the cooling body 53 on the other side of the line 160.

Thus, an electric machine 10 with a housing 13 is disclosed, which housing has a bearing shield 13.2, and with a rotor 20 which is mounted by means of the bearing shield 13.2, wherein a fan 30 fastened to the rotor 20 is suitable for generating a cooling air flow along a cooling air path 46 through the housing 13, with a rectifier circuit 151 which has a cooling body 53 which bears rectifier diodes, and the cooling body 53 is covered by a protective cap 47, wherein a web 118 acts along a line 160 between the protective cap 47 and the cooling body 53, which web divides cooling air flowing in through the protective cap 47, and thus openings situated on both sides of the line 160 in the cooling body 53 can be passed through by flow in targeted or controlled fashion.

The cooling body 153 of the controller 91 has a plate-like base 167 from which the cooling fins 96 extend, which cooling fins stand in that cooling path part 110 of the cooling air flow which flows past the cooling body 153. The plate-like base 167 has a plate-like surface 168 which extends in an axial direction and in a radial direction.

Radially further to the inside, it is possible to see a wall 169 which extends in an axial direction and which runs over a certain angle segment in a circular ring segment shape and surrounds the slipring assembly 49 or the sliprings 171. This can already be seen from FIG. 4, which is a figure originating from a CAD system. Said wall 169 forms, together with a further wall 169, an axial gap 170, as can be seen more clearly in the internal plan view as per FIG. 7 (and also FIG. 4). Said gap 170 is delimited in a circumferential direction by a respective funnel surface 172 (radially outwardly projecting gap delimiting surface). Situated opposite the gap 170 and its funnel surfaces 172 radially to the outside is a channel wall 174. Said channel wall 174 has a total of three different sections: a first section is purely a wall section 175, which in the exemplary embodiment is of arcuate form. In this case, arcuate means that the wall section 175 extends in the circumferential direction. In the direction of ends 176 and 177 extending in the circumferential direction, the wall section 175 is adjoined by a respective side wall 178 and 179. Said side walls 178 and 179 are designed such that an ingress of spray water as a result of fording maneuvers, for example, is impeded. This is the case owing to the meandering form of the inlet 180 which is formed or situated on both sides of the wall section 175. In this case, the inlet 180 is preferably designed such that a quantity of water moved to the inlet or opening situated between the funnel surface 172 and side wall 179 is diverted substantially through an angle alpha of less than 90°, and subsequently through an angle beta of less than 90°. The wall 169 furthermore has a cutout 181 which is provided for the leadthrough of brushes 173 for the contacting of the sliprings 171.

Furthermore, ends (not shown in any more detail here) of the funnel surfaces 172, in this case radially outwardly extending ends, and an end of the side wall 179 extending substantially radially inward, are situated relative to one another such that an inlet 180 purely in a circumferential direction (circular path) is not possible. One could also describe the situation as being one in which, although a direct ingress is possible between the funnel surface 172 and channel wall 174, this however leads, in a rectilinear direction, to a flow which then impinges from the inside against the wall section 174 and thus loses energy. Basically, therefore, the design of the channel wall 174 in interaction with the wall 169 is essential initially only for an opening as described above. This prevents the direct ingress of water through the meandering inlet 180. In a second approximation, with regard to the axis of rotation and an axis of mirror symmetry 186 which is continuous in this case, it is essential that a second inlet 180 is arranged relative to the first inlet 180. This however need not be an exact mirror-symmetrical copy in geometrical terms; merely functional mirror symmetry is adequate. Said second inlet has the advantage that water passing through the first inlet, after impinging on the wall section 175, can emerge via the second inlet, which in this case has the function of an outlet. Liquid entering through the inlet 180 is however discharged not only in the circumferential direction through the second inlet 180 (outlet) but also in an axial direction of the channel wall 174. As is also evident in this connection from FIG. 2, the channel wall 174 projects radially outward to such an extent as to be situated opposite the hub 90, such that entering liquid that has been discharged from the channel wall 174 impinges on the hub in an axial direction and is directed away.

As can be seen in conjunction with FIG. 4, it is the case in the exemplary embodiment proposed here that a system is provided which has two inlets 180, a gap 170, two funnel surfaces 172, and a channel wall 174, as described here, altogether twofold over the circumference of the slipring assembly 49. This has the effect that, regardless of the installation position of the electric machine 10 about its axis of rotation 183, one type of protective cap 47 reliably ensures that entering liquid even in other applications is reliably discharged.

Figure 8:
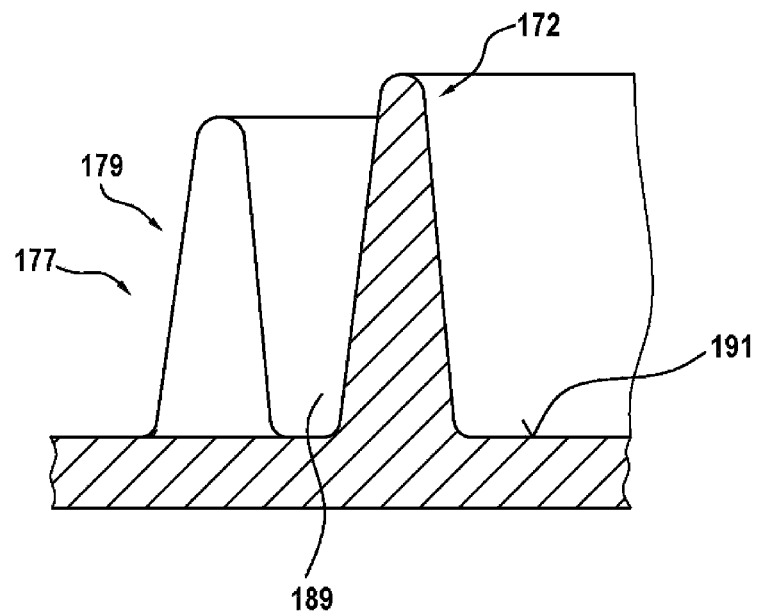
FIG. 8 shows a section through a funnel surface.

FIG. 8 illustrates a section through a funnel surface 172 on one end 177 and thus on the end of the side wall 179. As can be clearly seen, there are situated between the side wall 179 and the funnel surface 172—which could also be referred to as funnel wall because it is a wall with the funnel surface 172—a short step wall 189 which prevents the ingress of overflowing water (of a liquid medium). As can also be seen, it is provided that the wall 169 and also the channel wall 174 narrow in terms of their wall thickness toward their axial end in order to provide a defined outflow direction for the liquid medium (water). In short, protection against media is realized by different structural features: firstly by means of the overlap of the two walls at the opening, by means of the angle (alpha) at which the inner wall 169 projects radially, a narrowing wall thickness in the axial direction for providing a defined outflow direction for the medium, and said step or step wall 189 in the opening, that is to say in the inlet 180, for preventing the ingress of the outflowing medium.

Figure 8A:
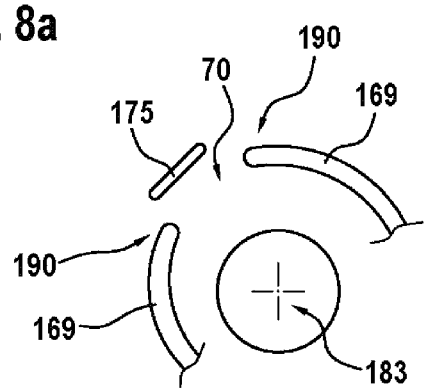
FIGS. 8*a*, 8*b*, 8*c*, and 8*d* show further diagrammatic illustrations relating to the slip ring chamber protection means.

FIGS. 8a, 8b, 8c and 8d show further diagrammatic illustrations regarding the slipring chamber protection means:

FIG. 8a shows an annular wall 169 with a gap 70 which, as viewed from an axis of rotation 183 of the rotor 20, is at least partially covered by a wall section 175 which, furthermore, as measured from the axis of rotation 183 at an edge 190 of the gap 70, is arranged at a different radius than the wall 169, wherein the wall 169 and the wall section 175 are integrally connected to one another.

Figure 8B:
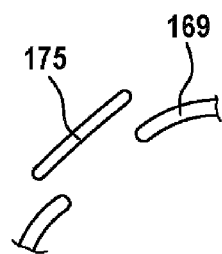

As a slight variation, FIG. 8b furthermore shows that the wall section 175 fully covers the gap 70 in the circumferential direction as viewed from the axis of rotation 183. That is to say the wall section, over an axial length, covers the gap 70 over a circumferential angle which is greater than the opening angle of the gap 70.

Figure 7:
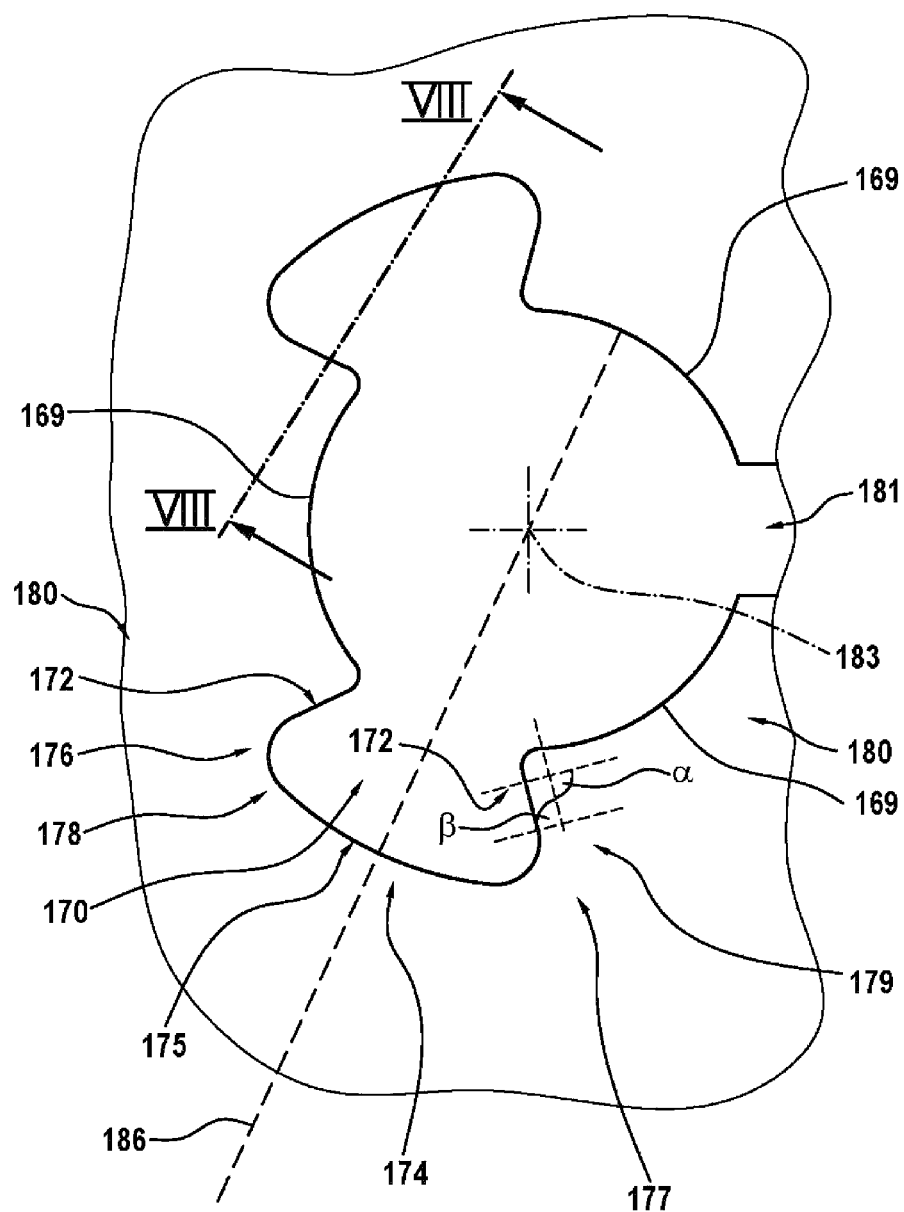
FIG. 7 shows an internal plan view of the protective cap.
Figure 8C:
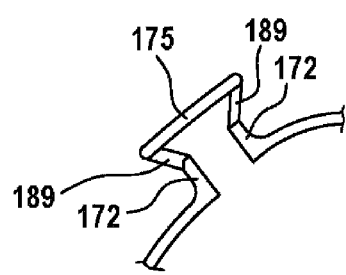

As already shown for the exemplary embodiment as per FIGS. 7 and 8, the exemplary embodiment as per FIG. 8c also shows, between the wall section 175 and the wall 169, a step wall 189 which extends from a plane 191 (FIG. 8) of the protective cap 47 and which is shorter than the wall section 175 and the wall 169. Such a step wall 189 may be provided in all exemplary embodiments with wall 169 and wall section 175.

Figure 8D:
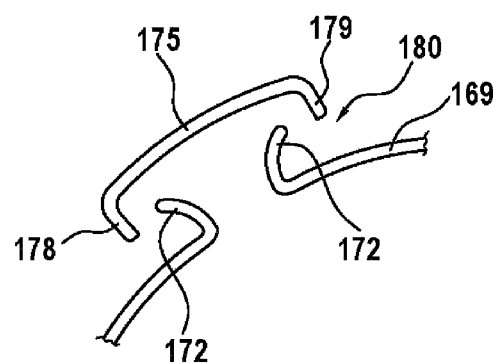

As shown in FIGS. 8, 8c and 8d, it is possible at each corresponding gap 70 for gap delimiting surfaces 172 to be provided on both sides of the gap 70, such that the gap 70 is delimited in the circumferential direction by in each case one gap delimiting surface 172. The gap delimiting surfaces 172 are, both in FIG. 8 and in FIG. 8d, engaged around by side walls 178, 179 which extend from the wall section 175.

In FIGS. 7 and 8 and 8d, it is provided that, between the wall section 175 and the wall 169, there is situated an inlet 180 which requires an at least single diversion of spray water in order to conduct said spray water to the gap 70.

Further structural features for said slipring chamber protection means are that the two walls or the funnel surface 172 and the side wall 179 overlap one another by 0.5 to 10 mm in the region of the inlet 180. It is furthermore provided that the angle alpha should be between 20 degrees and 140 degrees. The above-mentioned narrowing should amount to up to 90% of the wall thickness in the axial direction. The step wall 189 should amount to 0.5 to 90% of the wall height in the opening in order to prevent the ingress of the outflowing medium.

It can also be seen from FIG. 8 that the funnel surface 172 or the associated wall is higher than the channel wall 174.

Figure 9:
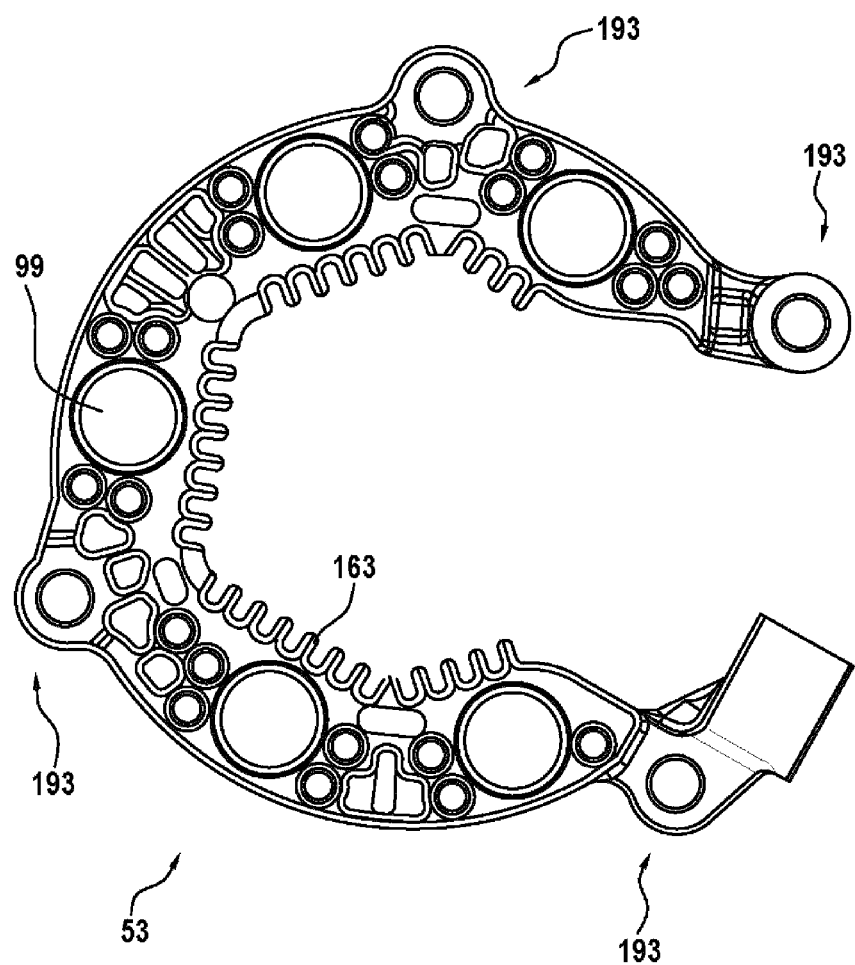
FIG. 9 shows the upper side, facing away from the bearing shield, of the positive cooling body.

In FIG. 9, it is possible to see the top side, facing away from the bearing shield 13.2, of the cooling body 53. The cooling body 53 has, on its inner circumference which, for the most part, is substantially polygonal, cooling fins 163 as already mentioned above. The cooling body 53 has a total of four screw connection points 193 which preferably serve for the fastening of the cooling body 53 over the interconnection device 130.

Figure 10:
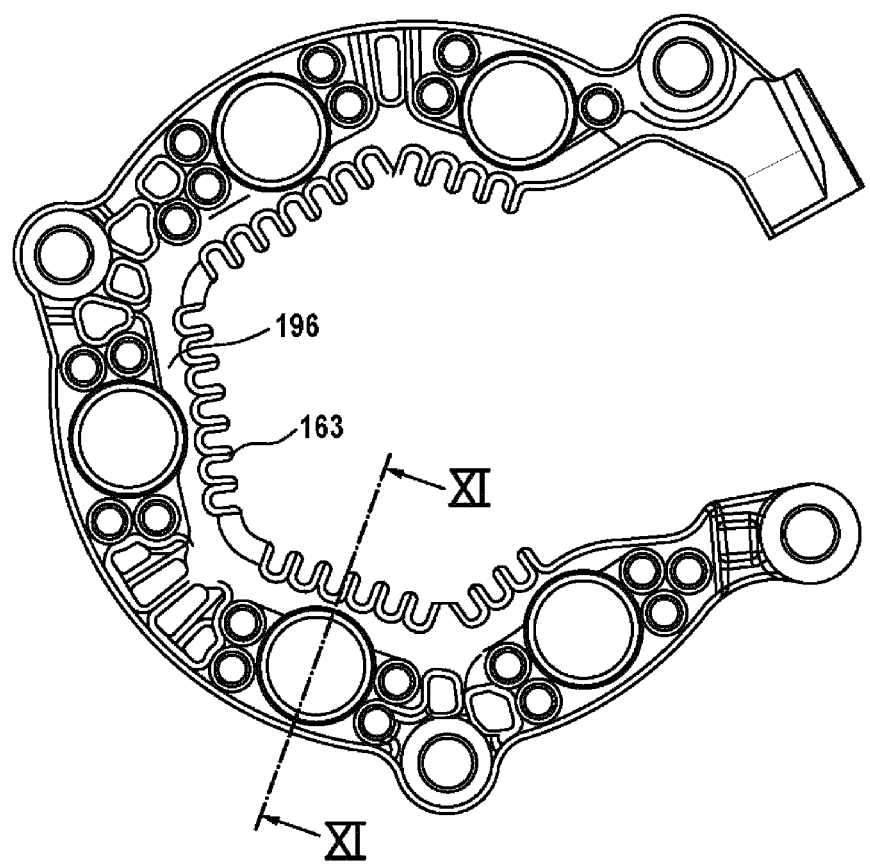
FIG. 10 shows the positive cooling body from its underside.
Figure 11:
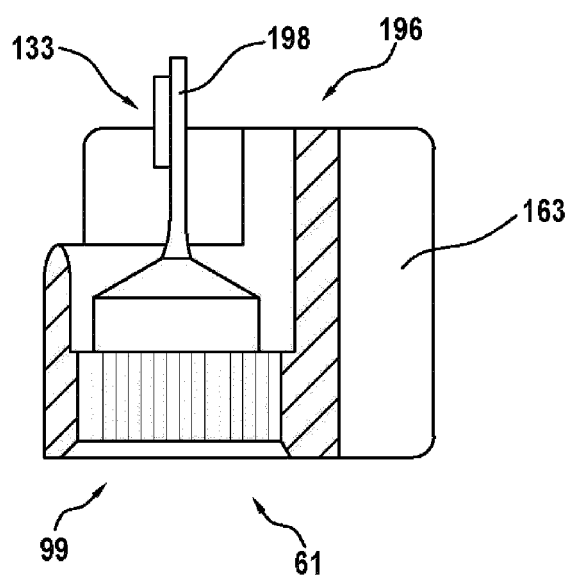
FIG. 11 shows a diode fastened in the positive cooling body.

FIG. 10 shows the positive cooling body 53 from its underside and thus from the side facing toward the bearing shield 13.2. Situated directly adjacent to the cooling fins 163 is a web 196. As can be seen both from FIG. 10 and from FIG. 11, the web 196 is adjoined by the cylindrical opening 61 into which a positive diode 99 is inserted. The positive diode 99 is equipped with a diode head wire 198 which serves for interconnection with the interconnection element 133.

Figure 12:
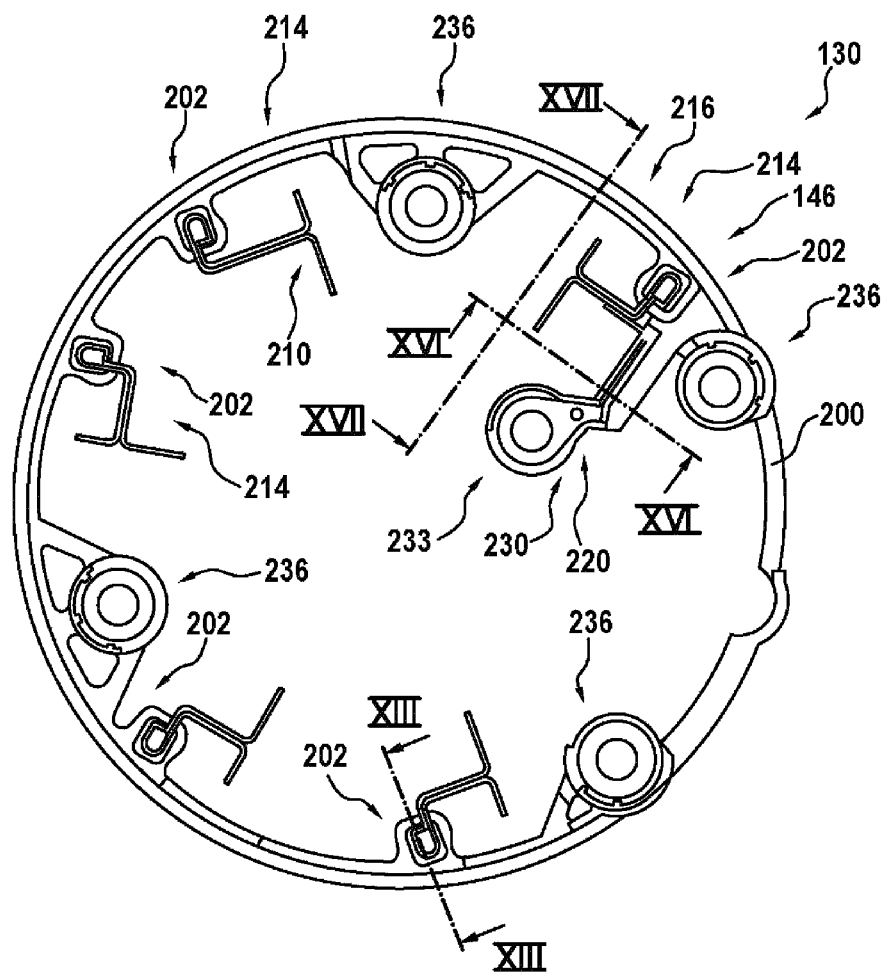
FIG. 12 shows the interconnection device.

FIG. 12 illustrates the interconnection device 130. Said interconnection device 130 has inter alia a support element 200 which, in this exemplary embodiment, is of annular overall form. The support element 200 need not be of annular form and, overall, it would also be possible for multiple support elements to be provided which ultimately functionally replace the one support element. Here, it is the object of the support element to have for example at least one guide sleeve preferably integrally formed thereon. In this exemplary embodiment, the support element 200 has a total of five guide sleeves 202, because the electric machine 10 is an alternator with a five-phase or five-strand stator winding 18. The guide sleeve 202 has a lower section which is altogether of tubular design and which, by way of its internal funnel-like contour 203, receives winding wires which are to be inserted, or at least one winding wire 204 of the stator winding 18, with a centering action. Said centering section 206 is adjoined preferably integrally by a receiving section 208. Said receiving section 208, which is of thinner-wall form, is adjoined by an upwardly directed mouth 209 of the centering section 206; see also, in FIG. 13, the sectional illustration XIII-XIII as indicated in FIG. 12. An interconnection element 133 as already mentioned above is received by way of a plug-in section 210 in the receiving section 208, such that an interconnection element 133; 146 is inserted into a receiving section 208. A support element 200 thus supports at least one interconnection element 133, 146. The plug-in section of the interconnection element 133 is followed, after a notch 211, by a connecting section 212. Said connecting section is in this case formed, for example, as a clamping section. Said clamping section or connecting section 212 serves for connecting a winding wire 204 to the interconnection element 133 and thus to the positive and negative diodes 99, 58 in a suitable manner so as to form a bridge circuit.

Figure 13:
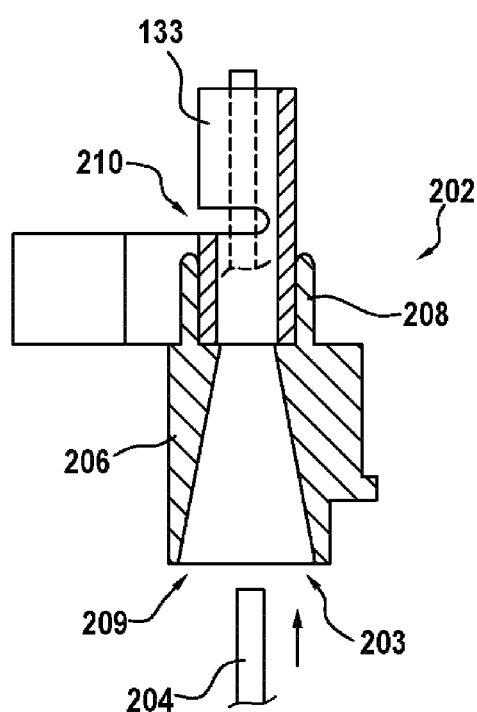
FIG. 13 shows a sectional illustration as per FIG. 12.

In FIG. 13, the final position of the winding wires 204 or of the winding wire 204 is indicated by dashed lines.

Four of the five interconnection elements 133, 146 are of substantially identical construction. The interconnection elements 133 different merely in orientation and/or in length. This means that the interconnection elements 133 have, in some cases, an arm 214 running in the circumferential direction and clockwise, and in some cases, an arm which runs in the circumferential direction counterclockwise.

Figure 14:
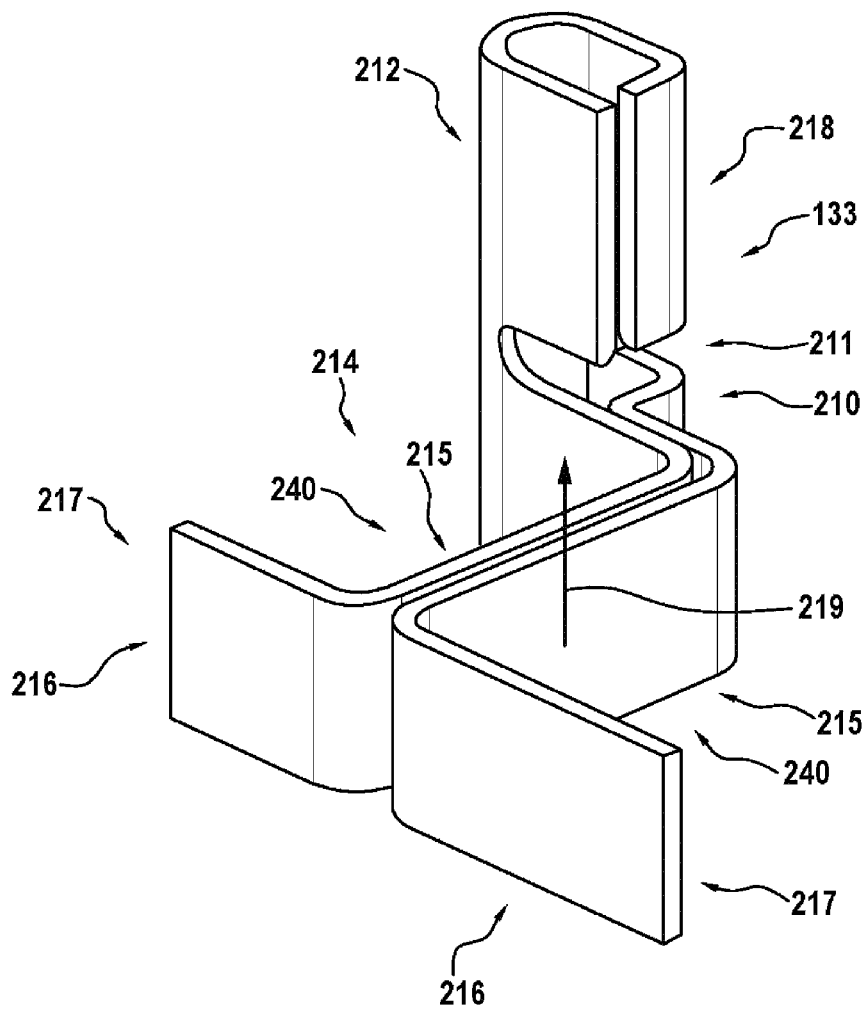
FIG. 14 shows an embodiment of an interconnection element.

The interconnection element 133 illustrated in FIG. 14 has an arm 214 which is intended to run counterclockwise. The arm 214 of the interconnection element 133 in FIG. 14 has in this case two half-arms 215 which each extend in integral fashion from the plug-in section 210. Each half-arm 215 is adjoined in integral fashion by a connecting section 216. Said connecting sections 216 serve for the contacting of diode head wires 198. For this purpose, the diode head wires 198 are preferably soldered or welded or connected using some other connecting technique, for example by positive locking. In this case, the two connecting sections 216 extend from the arm 214 in such a manner that said connecting sections 216 have, for example, ends 217 directed oppositely to one another. The connecting section 212 of an interconnection element 133 initially has substantially a U-shape, see also FIG. 15. However, from one leg of a U-shape of the connecting section 212, there extends an angled gripping section 218 which prevents a winding wire 204 which has been pushed or inserted into the connecting section 216 from departing from the U-shaped connecting section 16 under the pressure of welding tongs. The half-arms 215 are, before the connecting sections 216, arranged directly adjacent to one another. After the connection of the connecting sections 216 to the diode head wires, it may be the case that the half-arms 215, in the surface direction of the metal sheets, are arranged so as to be twisted slightly relative to one another. Provision is furthermore made for the half-arms 215, the connecting sections 216 and the plug-in section 210 to be bent around an axial direction 219. The axial direction corresponds in this case to the axis of rotation 183. Here, reference is made only to the direction of the axis and not to the position of the axis. There are thus multiple bends in the direction of an axial direction at different points of the metal sheet. The half-arms 215 and the connecting sections 216 are together oriented so as to form a T-shape.

Figure 14A:
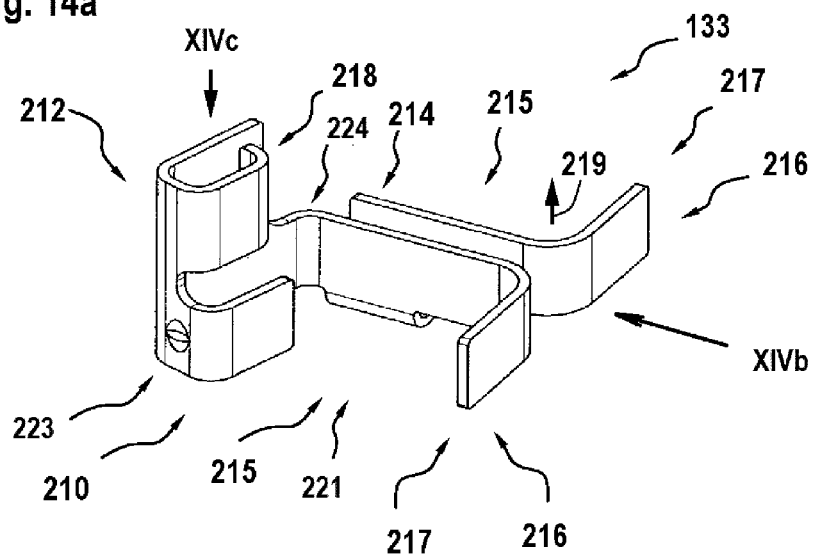
FIG. 14*a*, 14*b* and FIG. 14*c* show a further embodiment of an interconnection element.
Figure 14B:
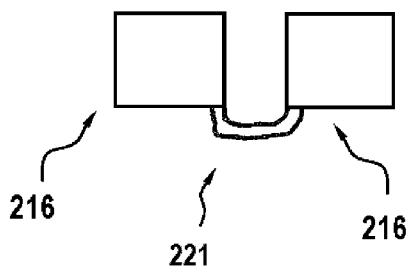
Figure 14C:
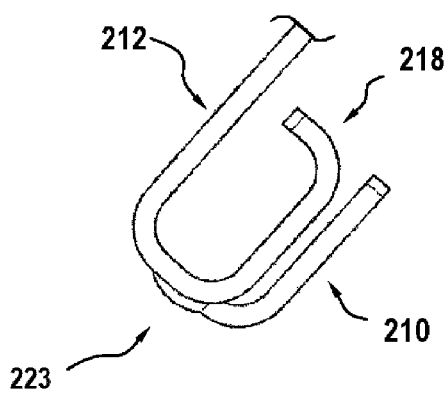

The interconnection element 133 illustrated in FIGS. 14a, 14b and 14c is an alternative to the interconnection element 133 illustrated in FIG. 14. From a connecting section 212 there extends an arm 214 which is intended to run counterclockwise. The arm 214 of the interconnection element 133 in FIG. 14a has, in this case, two half-arms 215 which are integrally connected to one another at a connecting bend 221, cf. also FIG. 14b. From the connecting section 212 there extends, in integral fashion, a short strap-like sheet-metal section or intermediate section which transitions into one half-arm 215. The connecting bend 221 extends from said one half-arm 215 and then transitions into the other half-arm 215. Each half-arm 215 is adjoined in integral fashion by a connecting section 216. Said connecting sections 216 serve for the contacting of diode head wires 198. For this purpose, the diode head wires 198 are preferably soldered or welded or connected using some other connecting technique, for example by positive locking. Here, the two connecting sections 216 extend from the half-arms 215 such that said connecting sections 216 have, for example, ends 217 directed oppositely to one another (two mutually averted L-shapes). The connecting section 212 of an interconnection element 133 initially has substantially a U-shape, see also FIG. 14a and FIG. 14c. However, from one leg of a U-shape of the connecting section 212, there extends an angled gripping section 218 which prevents a winding wire 204 which has been pushed or inserted into the connecting section 212 from departing from the U-shaped connecting section 212 under the pressure of welding tongs. The half-arms 215 are, before the connecting sections 216, arranged directly adjacent one another. After the connection of the connecting sections 216 to the diode head wires, it may be the case that the half-arms 215, in the surface direction of the metal sheets, are arranged so as to be twisted slightly relative to one another. The upper edges of the half-arms, which are parallel to one another in the drawing, are then not arranged parallel to one another. Provision is furthermore made for the connecting sections 216 and the plug-in section 210 to be bent around an axial direction 219 or axes parallel thereto. Here, reference is made only to the direction of the axis and not to the position of the axis. There are thus multiple bends in the direction of an axial direction at different points of the metal sheet. The half-arms 215 and the connecting sections 216 are together oriented so as to form a T-shape. FIG. 14c illustrates a plan view of the connecting section 212.

The connecting section 212 is divided into a section, the plug-in section 210, which serves for enabling the interconnection element 133 to be placed into and held in the receiving section 208, cf. also FIG. 13. The plug-in section 210 is bent in a U-shape and has, in the region of the lowest point of the U-shape, a bulged protuberance 223 (pimple). This protuberance serves for generating punctiform clamping in the receiving section and thus making it possible to realize a holding action by way of a mixture of non-positive locking and positive locking between the plug-in section 210 and receiving section 208. The same may also be provided in the case of the interconnection element 133 as per FIG. 14. The U-shape of the connecting section 212 is of a smaller width than the U-shape of the connecting section 212; this may also be provided in the case of the exemplary embodiments as per FIGS. 13, 14 and 15.

Thus, for the interconnection element 133; 146, a plug-in section 210 is disclosed, axially above which there is arranged a connecting section 212, wherein one half-arm 215 extends at least indirectly and in integral fashion from the plug-in section 210, from which half-arm there branches off a connecting bend 221 which transitions into the other half-arm 215. Between the plug-in section 210 and the half-arm 215 there may be arranged an intermediate section 224 as a simple connecting section. The intermediate section 224 may be of angled design.

Figure 15:
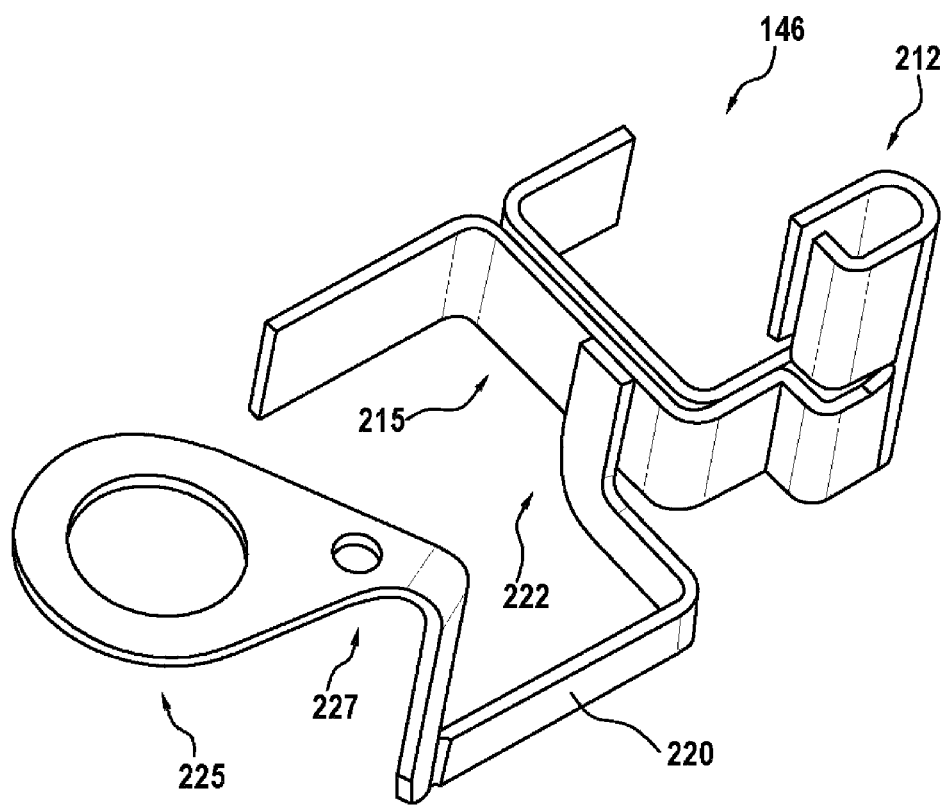
FIG. 15 shows a further embodiment of an interconnection element.
Figure 16:
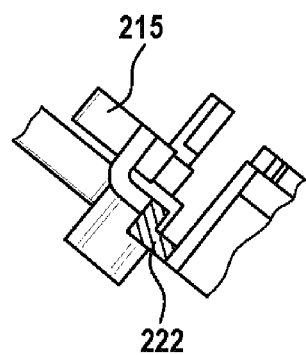
FIG. 16 shows a sectional illustration as per FIG. 12.

FIG. 15 illustrates a further exemplary embodiment of an interconnection element 146. Said interconnection element 146 is shown in FIG. 12 at approximately the 2 o'clock position. A further connecting section 220 extends from the interconnection element 146, and in this case specifically from one half-arm 215. Said connecting section 220 is, as per FIG. 16, mounted in a rail which is of U-shaped cross section and which is connected integrally to the support element 200. The connecting section 220 is cohesively connected (welding, soldering) to the interconnection element 146 or to a half-arm 215 at a connecting point 222. The connecting section 220 is of multiply angled design and ends at an eyelet 225. In the connecting section 220 and still before the eyelet 225, there is situated a connecting hole 227. Said connecting hole receives a peg 230, as per FIG. 12. Said peg is, like a rivet, subjected to hot calking, that is to say the peg 230 produced from a thermoplastic material is deformed and, by way of an undercut, holds the connecting section 220 in a positionally fixed manner on the support element 200.

The connecting section 220 is embedded in a U-shaped profiled rail of the support element 200 and is placed, in accordance with the profile of the connecting section 220, on an eyelet support 233. As can be seen from FIG. 12, the interconnection elements 133, 146 are oriented differently: for example, in each case one interconnection element 133 is arranged at the 11 o'clock and 10 o'clock positions, the arms 214 of which interconnection elements are oriented so as to point away from one another and thus in different circumferential directions of the support element 200. Furthermore, two interconnection elements 133 are in turn arranged at the 11 o'clock position and at the 2 o'clock position, wherein the arms 214 are oriented with respect to one another such that the connecting sections 216 are directed toward one another. This means that the arms 214 point toward one another in the circumferential direction.

Thus, an electric machine having a bearing shield 13.2, on which an interconnection device 130 is mounted, is disclosed, which electrical machine has at least one interconnection element 146 which serves for the interconnection of at least one positive diode 99 and one negative diode 58 with a winding wire 204 of the stator winding 18, having a connecting section 220 which serves for the provision of a phase signal to a controller 91, having a U-shaped cooling body 193 which is arranged around an axis of rotation 183, wherein the U-shaped cooling body 193 and the bearing shield 13.2 receive the connecting section 220 between them.

With reference to FIG. 12, it can furthermore be seen that the support element 200 has at least one radially inwardly oriented fastening eyelet 236. In the exemplary embodiment, a total of four fastening eyelets 236 are provided.

Figure 17:
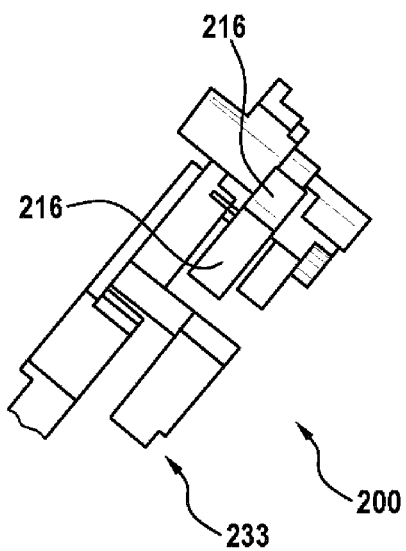
FIG. 17 shows a sectional illustration as per FIG. 12.

FIG. 17 illustrates inter alia how the two connecting sections 216 of an interconnection element 146 (this also applies to the interconnection elements 133) are arranged so as to point away from one another, and the eyelet support 233 is of raised form.

Figure 18:
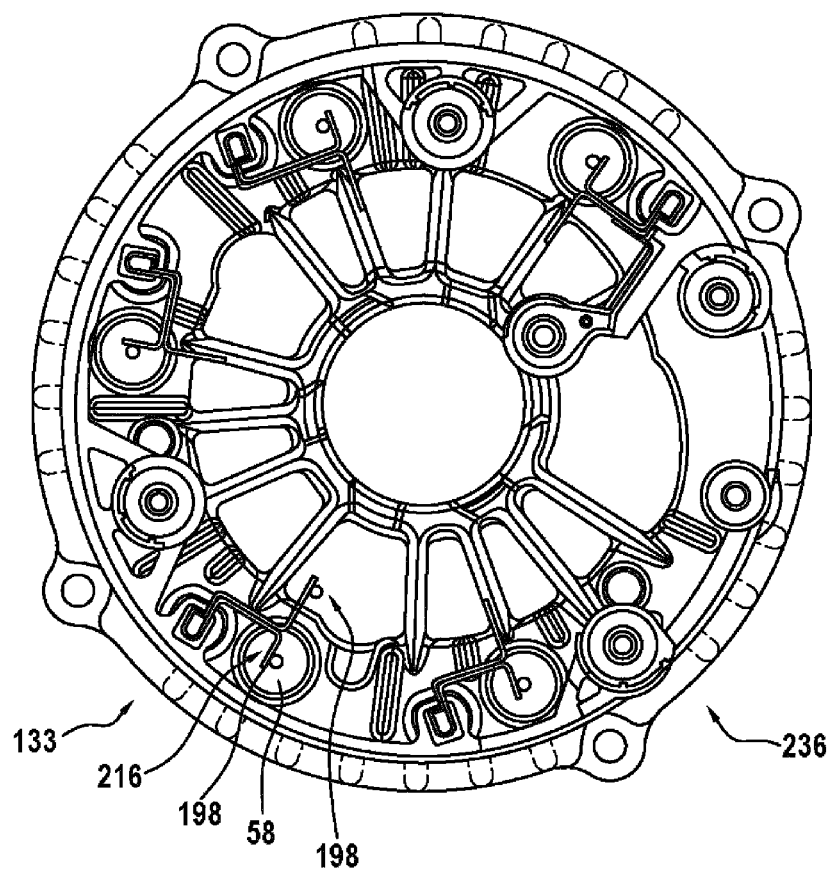
FIG. 18 shows a view of the bearing shield without cooling body.

Viewed together with FIG. 18 and FIG. 6, it can be seen that the above-mentioned fastening eyelets 236 are seated on small domes 239 and, there, are fastened by means of fastening elements (screws) to threads formed into the domes 239. The view in FIG. 18 also shows how the interconnection elements 133 are in this case connected to negative diodes 58. For example, FIG. 8 shows a negative diode 58 whose diode head wire 198 is connected to a connecting section. The same is also shown on the left in FIG. 6. In said figure, it is also clear that a positive diode 99 is connected by way of its diode head wire 198 to the connecting section 216 of the other half-arm 215. Said half-arms 215 furthermore allow only relatively low forces to act on the diode head wires 198, because these are not fixed to one another in the region of the half-arm 215. In this way, displacements of the half-arms 215 in the axial direction of the rotor are possible.

An electric machine designed as an alternator, having a rotor (20) and having an axis of rotation (183), having a stator iron (17) which holds a stator winding (18), wherein the stator winding (18) has phase terminals of winding wire (204), having a rectifier circuit (151) which has at least one bridge circuit composed of a positive diode (99) and a negative diode (58), is thus known. The positive diode (99) and a negative diode (58) are connected in electrically conductive fashion by means of an interconnection element (133; 146) to a phase terminal of winding wire (204), wherein the interconnection element (133; 146) is composed of sheet metal and has two half-arms (215), wherein one half-arm (215) is connected in electrically conductive fashion by means of a connecting section (216) to a positive diode (99) and another half-arm (215) is connected in electrically conductive fashion by means of another connecting section (216) to a negative diode (58), wherein the half-arms (215) are, before the connecting sections (216), oriented such that sheet-metal surfaces 240 are oriented perpendicular to an axis of rotation (183) of the rotor (20), and the half-arms (215) are arranged parallel and adjacent to one another over a length segment before the connecting sections (216), wherein the connecting sections (216) extend from a respective half-arm (215) and have ends (217) directed oppositely to one another.

The invention claimed is:

1. An alternator (10), having a rotor (20) and an axis of rotation (183), having a stator iron (17) which holds a stator winding (18), wherein the stator winding (18) has phase terminals of winding wire (204), and having a rectifier circuit (151) which has at least one bridge circuit including a positive diode (99) and a negative diode (58), wherein the positive diode (99) and the negative diode (58) are connected in electrically conductive fashion by means of an interconnection element (133; 146) to a phase terminal of winding wire (204), wherein the interconnection element (133; 146) is made of sheet metal and has two half-arms (215), wherein one half-arm (215) is connected in electrically conductive fashion by means of a connecting section (216) to a positive diode (99) and another half-arm (215) is connected in electrically conductive fashion by means of another connecting section (216) to a negative diode (58), wherein the half-arms (215) are, before the connecting sections (216), oriented such that sheet-metal surfaces (240) are oriented to extend to the connecting sections (216) perpendicular to an axial direction (219) of the axis of rotation (183) of the rotor (20), and the half-arms (215) are arranged parallel and adjacent to one another over a length segment before the connecting sections (216), wherein the connecting sections (216) extend from a respective half-arm (215) and away from one another in a direction perpendicular to the axial direction (219) of the axis of rotation (183), and have ends (217) directed oppositely to one another.

2. The alternator (10) as claimed in claim 1, characterized in that the half-arms (215) are, before the connecting sections (216), arranged directly adjacent to one another.

3. The alternator (10) as claimed in claim 1, characterized in that the half-arms (215) are arranged so as to be twisted relative to one another.

4. The alternator (10) as claimed in claim 1, characterized in that the interconnection element (133; 146) is inserted into a receiving section (208).

5. The alternator (10) as claimed in claim 1, characterized in that the interconnection element (133; 146) has a plug-in section (210), axially above which there is arranged a connecting section (212), wherein, from the plug-in section (210), there extends a half-arm (215) from which there branches off a connecting bend (221) which merges into the other half-arm (215).

6. The alternator (10) as claimed in claim 1, characterized in that, from one interconnection element (146), there extends a connecting section (220) which serves for providing a phase signal to a controller (91), having a U-shaped cooling body (193) which is arranged around the axis of rotation (183), wherein the U-shaped cooling body (193) and a bearing shield (13.2) receive the connecting section (220) between them.

7. The alternator (10) as claimed in claim 5, characterized in that the half-arms (215), the connecting sections (216) and the plug-in section (210) are bent around the axial direction (219) of the axis of rotation (183).

8. The alternator (10) as claimed in claim 1, characterized in that the half-arms (215) and the connecting sections (216) are together oriented so as to form a T-shape.

9. The alternator (10) as claimed in claim 1, characterized in that a support element (200) supports at least one interconnection element (133, 146).

10. The alternator (10) as claimed in claim 8, characterized in that the interconnection element (133, 146) is received in a receiving section (208).

\* \* \* \* \*